United States Patent

Ketcham

Patent Number: 6,058,291
Date of Patent: May 2, 2000

[54] METHODS AND APPARATUS FOR CARRIER SUPPRESSION IN A RADIO MODULATOR

[75] Inventor: Carl Ketcham, Taylorsville, Utah

[73] Assignee: 3Com Corporation, Santa Clara, Calif.

[21] Appl. No.: 08/984,566

[22] Filed: Dec. 3, 1997

[51] Int. Cl.[7] .............................. H04B 1/68; H04B 1/04; H01Q 11/12

[52] U.S. Cl. ............................ 455/46; 455/116; 455/126; 329/315; 375/222

[58] Field of Search ............................... 455/67.3, 46, 21, 455/7, 59, 109, 116, 119, 202, 293, 295, 296, 309, 312; 329/315, 345; 332/108, 119, 151

[56] References Cited

U.S. PATENT DOCUMENTS

| | | | |
|---|---|---|---|
| 3,970,937 | 7/1976 | Bates et al. | 325/49 |
| 4,048,566 | 9/1977 | Carson et al. | 325/329 |
| 5,077,542 | 12/1991 | Lanoiselee | 332/151 |
| 5,506,548 | 4/1996 | Kajimoto et al. | 332/170 |

*Primary Examiner*—Edward F. Urban
*Assistant Examiner*—Sheila Smith
*Attorney, Agent, or Firm*—Workman, Nydegger & Seeley

[57] ABSTRACT

Methods and apparatus for dynamically calibrating a modulator in a radio transmitter are provided. In a preferred embodiment an In-Phase and Quadrature (I/Q) modulator in a radio modem is calibrated by means of a modulator, a digital signal processor and a power sensor. The modulator being electrically adapted to receive a local oscillator input having a carrier frequency and a substantially direct current (DC) input having an amplitude in order to produce an output having a power magnitude at the carrier frequency in a frequency defined power spectrum. The power sensor being in electrically succession to the modulator to measure the power magnitude of the output to permit the digital signal processor (DSP), electrically between the modulator and the power sensor, to compare the measured power magnitude with a minimum threshold power magnitude to determine which is greater. If the power magnitude is greater, the DSP reiteratively alters the amplitude of the DC input until the measured power magnitude of the output is less than the minimum threshold power magnitude. The minimum threshold power magnitude is preferably stored in the digital signal processor and defines a suitable power magnitude threshold at the carrier frequency beneath which the carrier frequency component will be substantially suppressed. Thereafter, the appropriate amplitude of the DC input which enabled the power magnitude of the output to fall below the minimum threshold is established in the DSP as a temporary calibration coefficient for a selected duration of time. The selected duration of time being the time from the powering on until the powering off of the radio modem or until the transmitter is selected for re-calibration by the user.

10 Claims, 4 Drawing Sheets

METHODS AND APPARATUS FOR CARRIER SUPPRESSION IN A RADIO MODULATOR

BACKGROUND OF THE INVENTION

1. The Field of the Invention

The present invention relates generally to radio modulators. More specifically the present invention is related to methods and apparatus for dynamically calibrating an In-phase and Quadrature (I/Q) modulator to suppress the carrier frequency component before the transmission of information across a communication channel.

2. The Relevant Technology

Radio communication systems are well known within the prior art and are invaluably useful to modern society as a means of conveying information from one location to another. Integral, in some form, with every radio communication system is a radio modulator at the transmission end for converting information into radio transmission form and, at the receiving end, a radio demodulator for converting the radio transmission form back into information. While modulators and demodulators convert information into radio transmission form and back again, most present-day radio communication systems additionally include circuitry, known as frequency mixers, to translate information frequencies into other frequencies and back again. Mixers exist in various embodiments and, depending upon the specific embodiment, may or may not allow the frequencies of the input signals to appear at the output. Double balanced mixers are one such exemplary mixer embodiment and are used to illustrate the problem herein. As is well known, a double balanced mixer separates input signals into two different channels, the in-phase and quadrature channels, but as described herein, will only be referenced as having a singular channel.

With reference to FIG. 1, a frequency spectrum output of an exemplary doubly balanced mixer is depicted generally as 20 with sidebands 22 being approximated by an envelope of a curve 24 that assumes a generally sin $(x^2/x)$ shape. With proper modulating techniques the carrier component 26 at frequency, fc, is suppressed. The problem, however, is that in many hardware devices incorporating a mixer means for suppressing the carrier component have failed or badly deteriorated. With reference to FIG. 2, it can be seen that an improperly suppressed carrier component 28 at the carrier frequency, fc, yields a corresponding power magnitude having an amplitude level A, commonly known as the DC offset. Although not problematic for all types of radio communication systems, amplitude level A is often unacceptably high when compared to the power magnitude of the information sidebands which are generally around amplitude level B. For example, in some present day devices, such as radio modems, the DC offset at amplitude level A is as much as 15–20 dB, or more, above the power magnitude of the information at amplitude level B. This power amplitude difference is frequently attributed to internal components that are subject to internal variations every time the device is powered on. Such components include, but are not limited to, self-calibrating digital-to-analog convertors (DACs) which are typically arranged in electrical precedence to the modulator. Since no information is contained in the carrier component and since the power magnitude at the carrier frequency is numerous decibels above information curve envelope 30, efficiency in the transmitter is lost when devices attempt to accommodate the excessive power magnitude of the "information-less" carrier component.

Radio transmitters typically also have final stage amplifiers electrically subsequent to the modulator or mixer stage to boost the power levels of the information before transmitting the information in radio form across a communication channel. Thus, an economic and componentry burden is introduced with amplifier circuitry that accommodates an overly high DC offset.

Moreover, since the carrier frequency is centrally positioned within the frequency range containing the information, the carrier component is not frequency filtered in the transmitter by any band pass filters. Yet the excessive power magnitude is still accommodated by componentry within these filters. For these and other similar reasons, it is desirable to suppress the carrier component.

The prior art has long been aware of these and other problems and has thus attempted various means to eliminate them. Suppression of the carrier component before transmission, however, still remains problematic. One known suppression means employs circuitry-related calibration coefficients that are pre-determined at the time of design for suppressing the DC offset at the carrier frequency. Although usually initially effective, the magnitude of the carrier is subject to drift over time and the calibration coefficients are eventually rendered ineffective. Moreover, since the calibration coefficients are pre-determined they are usually preset and installed at the manufacturing level. Thus, a user is unable to adjust the calibration coefficients and must seek factory repair or recalibration at an additional expense.

Temperature compensation circuits are also employed to suppress the carrier component, but they too are pre-determined and established at the time of installation and are similarly subject to drift characteristics over time. Thus, repair or recalibration comes with the foregoing described added expense.

Sometimes the carrier suppression is accomplished by an eclectic arrangement of both temperature compensation circuits and calibration coefficients and other related parameters such as the voltage supply. These arrangements, however, are complex in design and implementation thereof likewise leads to added expense.

On many older and some present day radio communication devices, an adjustable device, usually a potentiometer, is installed to allow the user to manually adjust and compensate for transmission related problems. But this too is subject to drift characteristics because the potentiometer is mechanically tuned and subject to being "un-tuned" by mechanical vibrations exerted upon the device. Such vibrations are exerted regularly during events such as jostling, bumping and carrying. Although the user may readjust or "tweak" the tuning setting, this takes time and is subject to human inaccuracies. The tweaking also requires that the user know when the device actually requires an adjustment which frequently remains unknown, especially concerning fine tuning adjustments. Manufacturing costs are also a concern with user calibration devices because increased costs typically accompany user calibration components. Such increased costs typically include the extra design for those components and the extra labor to install them.

Accordingly, it would be an advance to have a cost effective means of suppressing the carrier component before information is transmitted across a communication channel. It would also be an advance to provide for accurate calibration of the modulator, by other than factory installed or repair means, to allow calibration to be economically performed after the purchase of the device whenever it is required.

SUMMARY AND OBJECTS OF THE INVENTION

It is, therefore, an object of the present invention to provide a means for suppressing the carrier frequency component in a radio communication device.

It is another object of the present invention to provide a means for dynamically suppressing the carrier frequency component in a radio communication device by accommodating frequency, temperature and other variables exhibiting drift characteristics that adversely affect suppression of the carrier frequency component over time.

It is a further object of the present invention to provide a means for dynamically calibrating an I/Q modulator of a radio modem to suppress the energy at the carrier frequency resulting from a DC offset before information is transmitted across a communication channel.

Yet another object of the present invention is to provide a cost effective means of suppressing the carrier frequency component in a radio communication device.

In accordance with the invention as embodied and broadly described herein, the foregoing and other objectives are achieved by providing methods and apparatus for dynamically calibrating a modulator in a radio transmitter, preferably an In-Phase and Quadrature (I/Q) modulator in a radio modem. In a preferred embodiment the radio modem comprises a modulator, a digital signal processor (DSP) and a power sensor. The modulator is electrically adapted to receive a local oscillator input having a carrier frequency and a substantially direct current (DC) input having an amplitude in order to produce an output having a power magnitude at the carrier frequency in a frequency defined power spectrum. The power sensor, in electrical succession to the modulator, measures the power magnitude of the output so that the DSP, electrically between the modulator and the power sensor, can compare the measured power magnitude with a minimum threshold power magnitude. Based upon that comparison the DSP reiteratively alters the amplitude of the DC input until the measured power magnitude of the output is less than the minimum threshold power magnitude. The minimum threshold power magnitude is preferably stored in the digital signal processor and defines a suitable power magnitude threshold at the carrier frequency beneath which the carrier frequency component will be substantially suppressed. Thereafter, the appropriate amplitude of the DC input which enabled the power magnitude of the output to be below the minimum threshold is established in the DSP as a temporary calibration coefficient for a selected duration of time. The selected duration of time is preferably the time from the powering on until the powering off of the radio modem or until the user selects the transmitter to be recalibrated.

These and other objects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

Figure 1:
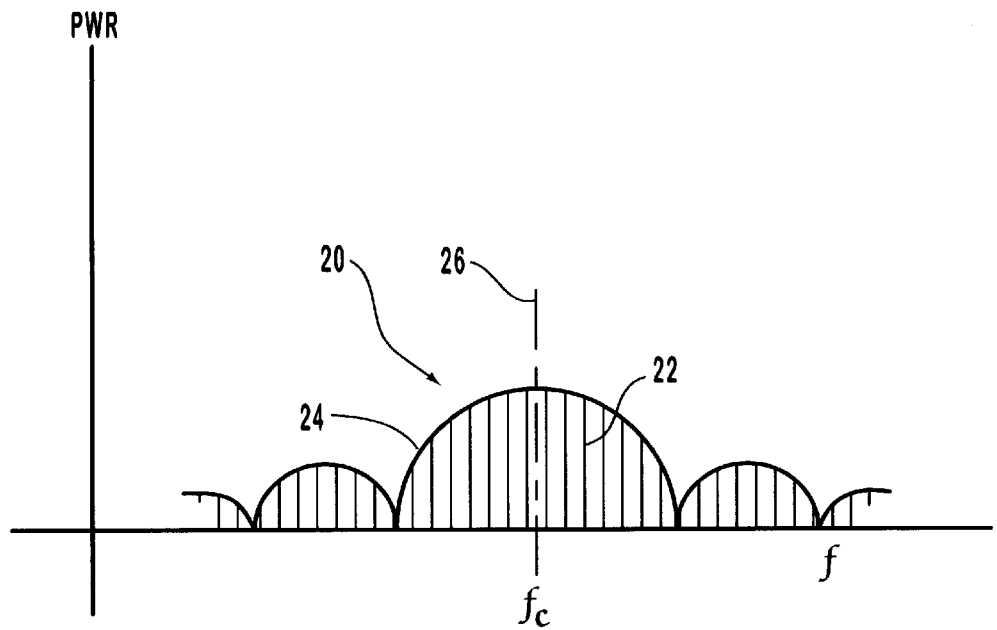
FIG. 1 is a prior art spectral output diagram of a radio frequency carrier and a pulse train combined in a doubly balanced mixer having a suppressed carrier component.
Figure 2:
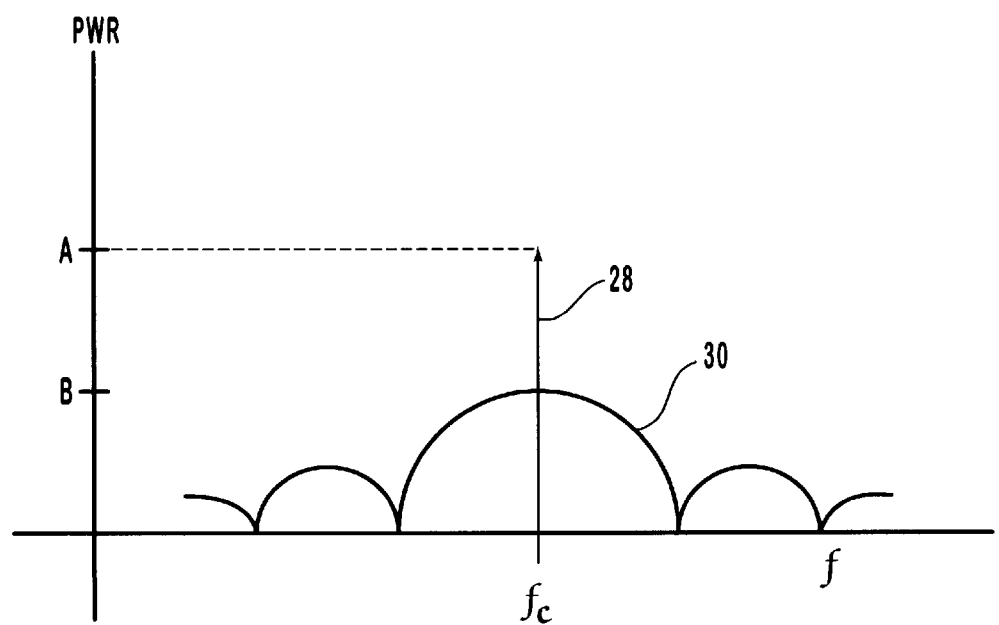
FIG. 2 is a prior art spectral output diagram of a radio frequency carrier and a pulse train combined in a doubly balanced mixer having no suppressed carrier component.
Figure 3:
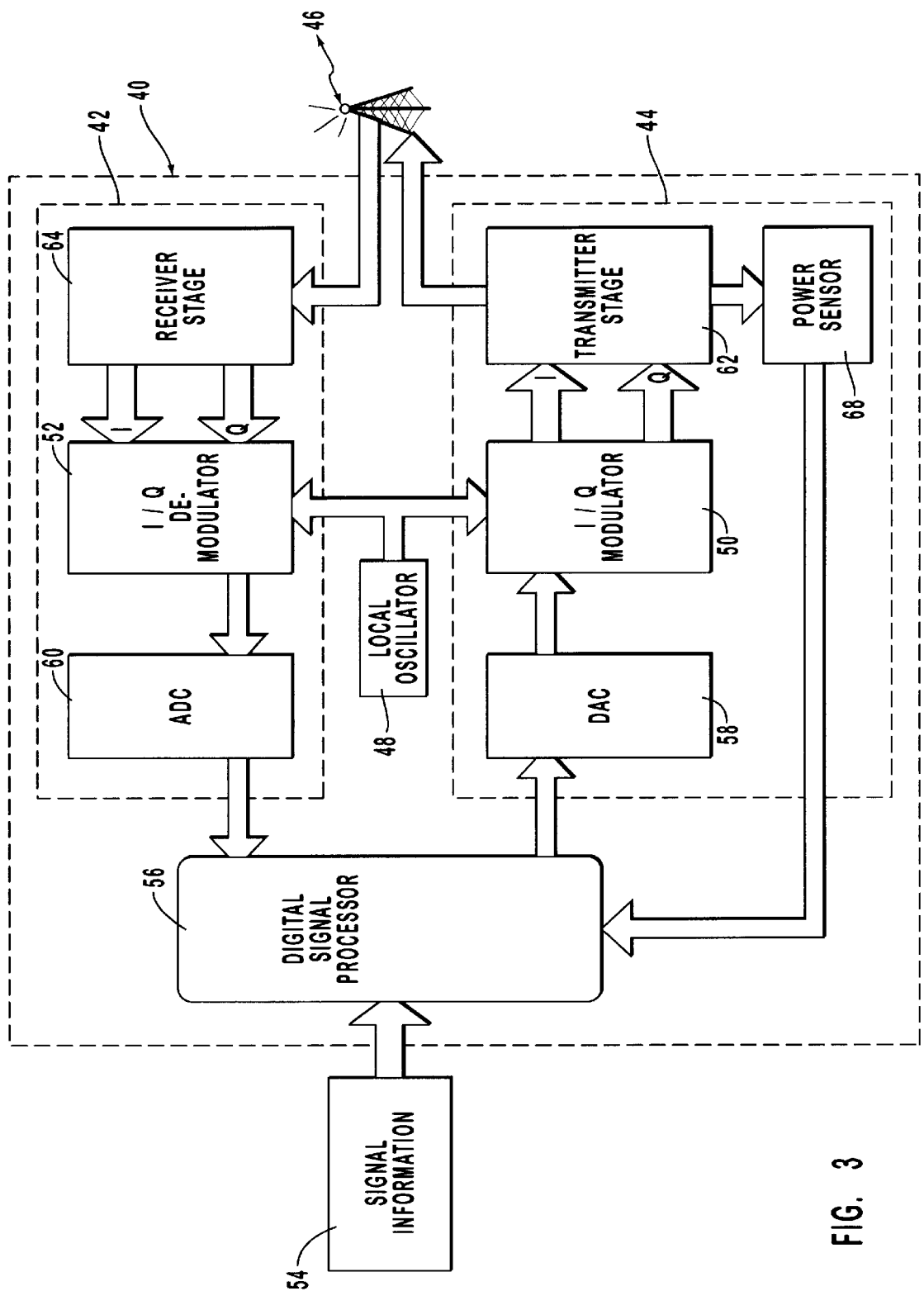
FIG. 3 is a block diagram of an exemplary radio modem able to dynamically calibrate an In-phase and Quadrature (I/Q) modulator to suppress the carrier component before information is transmitted across a communication channel, in accordance with the present invention.

The present invention is related to methods and apparatus for dynamically calibrating an In-phase and Quadrature (I/Q) modulator in a radio modem to suppress the carrier frequency component in a frequency defined power spectrum before information is transmitted across a communication channel. With reference to FIG. 3, a modem in accordance with the present invention is depicted generally as 40. The modem 40 is separated internally into a transmission and receiving end 42, 44 to convey and receive information, in radio form, across a communication channel 46. In means well known to those skilled in the art, a local oscillator 48 is respectively supplied to both the transmission and receiving ends 42, 44 as an input to a modulator 50 and a demodulator 52 to assist in the conveyance and reception of that information. In this embodiment, both the modulator and demodulator are separated into two channels, an in-phase (I) and quadrature (Q) channel, to separate input signals into two signals having a 90° phase difference. In this manner, both the I/Q modulator and de-modulator provide the modem 40 with flexibility in transmitting schemes available for the conveyance and reception of that information. Such transmitting schemes include, but are not limited to, AM, FM, GMSK, PSK, SSB and QAM.

Communicating with the transmitting and receiving ends, in a format suitable to both ends, is a digital signal processor (DSP) 56. In the transmitting end, the DSP communicates signal information 54 to the modulator to enable the signal information to be processed into suitable radio form for transmission across the communication channel. In the receiving end, the demodulator receives the signal information in radio form and processes out the signal information for communication back to the DSP. It should be appreciated that the signal information as used herein is a generic reference for any signal information that is usefully transmitted from one location to another, such as audio. In this embodiment, however, the signal information is data information such as a data stream being communicated to and from a computer (not shown). From FIG. 3, it should be apparent that the arrangement of the DSP is, respectively, in electrical precedence and succession to the modulator 50 and the demodulator 52. Assisting the DSP in the communication of data information to the modulator 50 and from the demodulator 52 is a digital-to-analog convertor (DAC) 58 and an analog-to-digital convertor (ADC) 60. Similar to the DSP, the DAC is in electrical precedence to the modulator and the ADC is in electrical succession to the demodulator. Completing the transmission and reception ends of the modem 40 is a transmitter stage 62 and a receiver stage 64 having various well known amplifier and filter stages therein for further assisting in the conveyance and reception of the data information.

Although the foregoing are generally well known components within a radio modem, the transmitting end of the present invention additionally has a power sensor 68 electrically coupled between the modulator 50 and the DSP 56. The power sensor is used to measure or sense the power of the modulated signal that is output from the modulator. Its operational use will be described more fully in the context of calibrating the I/Q modulator. Preferably the power sensor is arranged in electrical succession to the transmitter stage 62 but can alternatively be positioned in electrical precedence. As implemented, the power sensor can either be hardware, software or a combination thereof.

Figure 4:
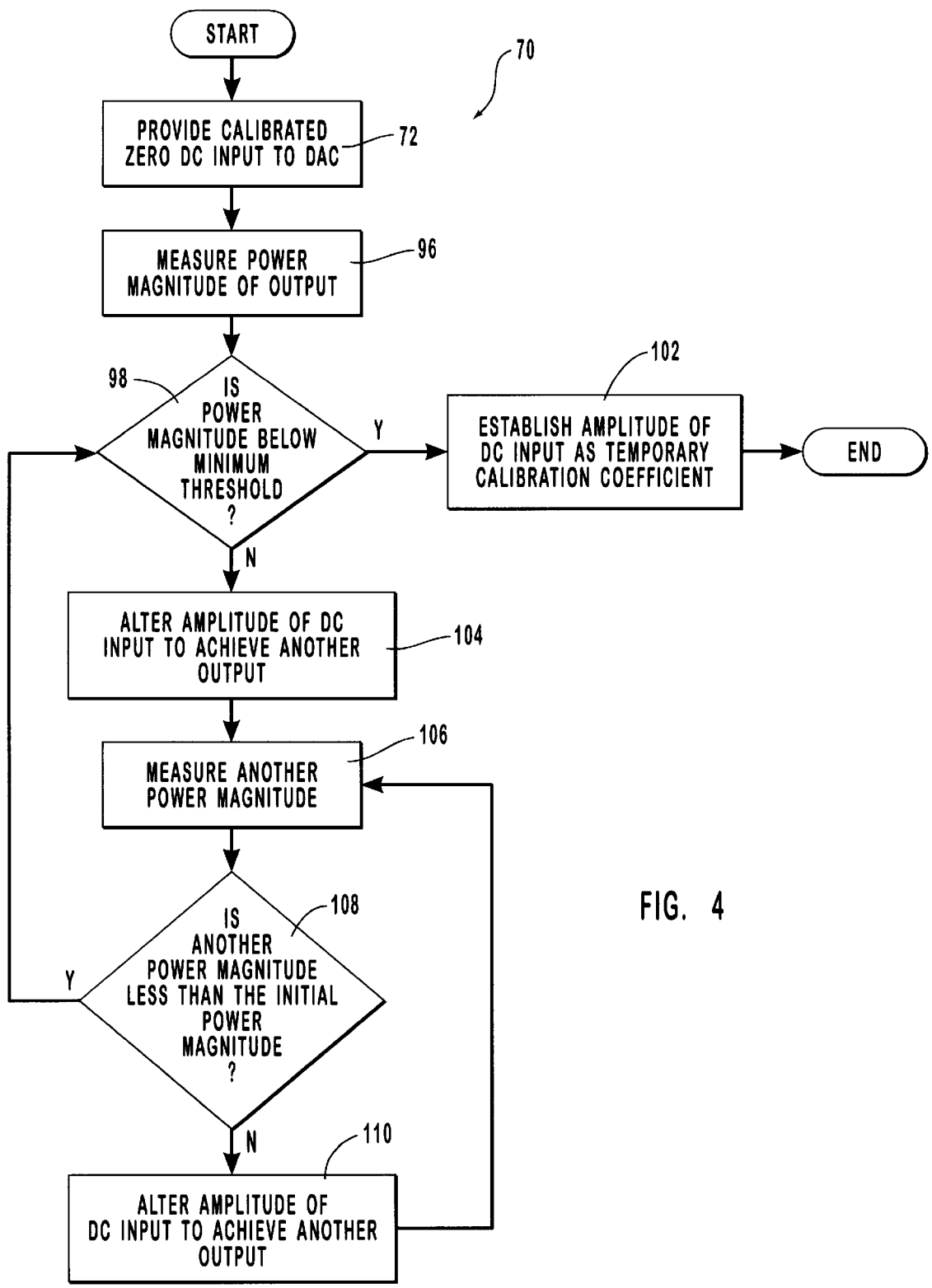
FIG. 4 is a flow diagram of a method of dynamically calibrating an I/Q modulator to suppress the carrier component before information is transmitted, in accordance with the block diagram of FIG. 3.
Figure 5:
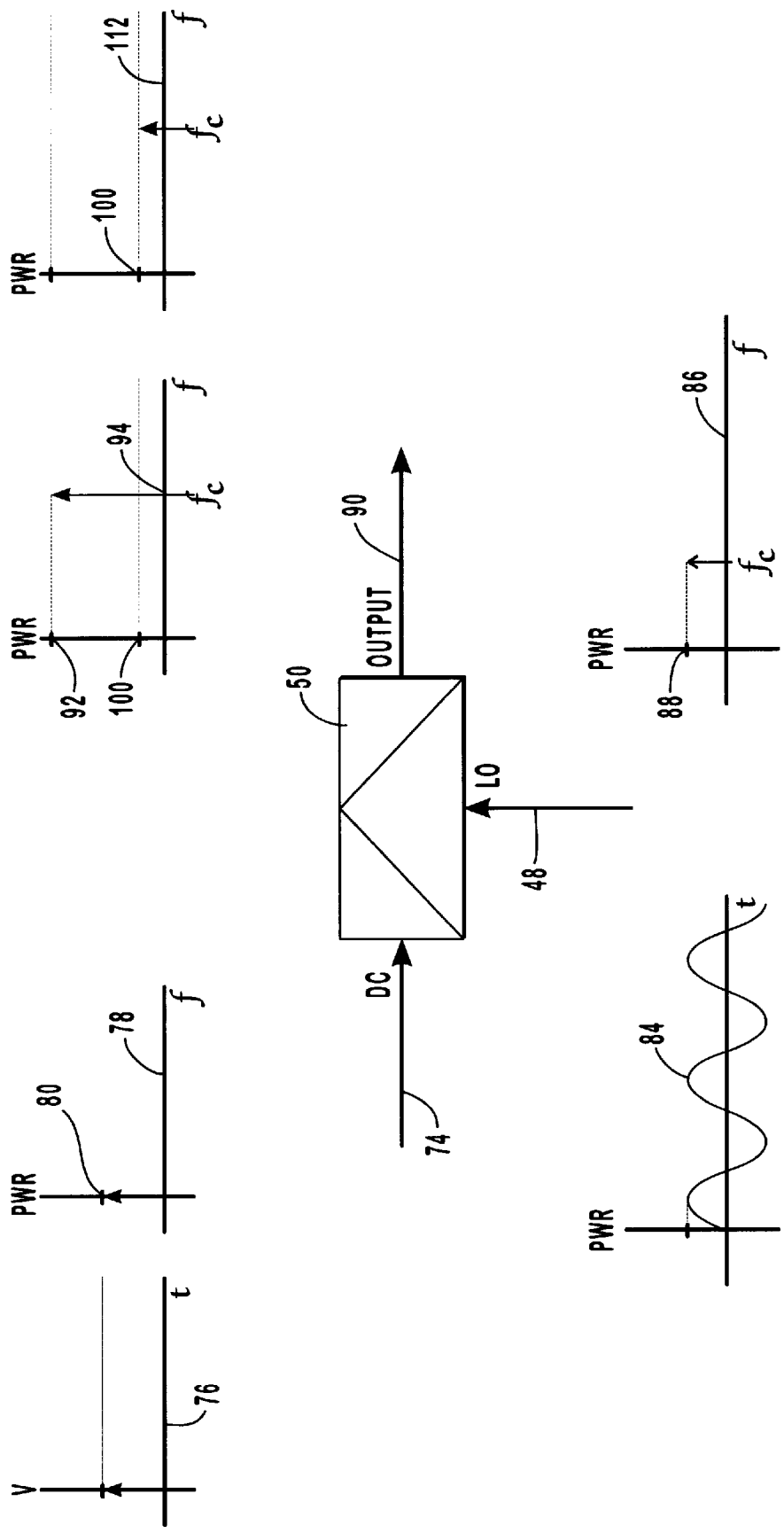
FIG. 5 is a time and frequency defined diagram of the electrical signals input into and output from the I/Q modulator of FIG. 3.

With reference to FIGS. 4 and 5, a method for overcoming the carrier suppression deficiencies noted in the prior art will now be described for calibrating the I/Q modulator of a radio modem in order to substantially suppress a carrier frequency component in a frequency defined power spectrum. In general, the operational hierarchy for calibrating the modulator is depicted generally as 70. As before, the modulator is used to transfer an information signal, preferably data, that is input to the DSP into a suitable radio form for transmission across the communication channel. However, in order to substantially ensure that an overly large energy component will not be present at the carrier frequency, the modulator is calibrated during the operational use of the radio modem. Hereinafter "calibration during the operational use" will be referred to as "dynamic" calibration. Dynamic calibration being distinguished from the prior art "static" or pre-determined calibration methods which have preset calibration means installed during the "non-use" stage of the modem at the manufacturing and repair depot levels.

Dynamic calibration of the modulator begins when the DSP electrically supplies a calibrated "zero" to the DAC step 72. The calibrated zero is representative of a state wherein the DSP either prevents a data information signal from being presented to the modulator or the source supplying the data information signal has no signal to convey. Thus, it should be appreciated that the calibrated zero has no information. It should be further appreciated that this prevention may be implemented by either software, hardware or a combination thereof and may take many forms. In response to the calibrated zero being supplied to the DAC, the DAC supplies a substantially direct current (DC) input to the modulator step 74. The DC input is supplied to a singular channel within the modulator, either the I or Q, irrespective of which channel is first supplied the DC input because the calibration steps will be repeated for the other channel.

With particular reference to FIG. 5, the DC input supplied to a channel of the modulator can graphically be seen in the time domain 76 as having a substantially constant voltage level (V). When converted to a frequency defined power spectrum, the DC input 78 has an amplitude 80 at a frequency equaling zero Hertz. The local oscillator 48 is simultaneously supplied to the modulator 50. The local oscillator input in the time domain 82, exemplarily represented by a sine wave 84, has oscillations occurring at a frequency rate, fc, the carrier frequency. When converted to the frequency defined power spectrum, the local oscillator input 86 has a power level 88 located at the carrier frequency. As depicted in FIG. 5, both the DC input 74 and the local oscillator input 48 are combined by the modulator 50 to produce an output 90 having, in the frequency defined power spectrum, a power magnitude 92 located at the carrier frequency 94.

With particular reference to the flow diagram, the output of the modulator is then measured by the power sensor at step 96 to determine the value of the power magnitude 92 of the output. Once measured, the power magnitude is communicated from the power sensor to the DSP to determine if the power magnitude is greater than or less than a minimum threshold power magnitude 98. The minimum threshold power magnitude is defined by various pre-determined criteria and is variable according to the type of signal information communicated, the equipment used to transmit and receive the signal information and the communication channel across which the signal information is communicated. In a preferred embodiment, the minimum threshold power magnitude is a value in the range of about 25–35 dB below an average power magnitude level of a data information signal that would typically be transmitted by means of a radio modem across the communication channel. In the frequency defined power spectrum of FIG. 5, the minimum threshold power magnitude is depicted as 100. Whatever the actual minimum threshold value, it is preferably stored in the DSP allowing a convenient and efficacious comparison between the minimum threshold and the power magnitude of the output to be determined. It should be appreciated, however, that storage of the minimum threshold could also be accomplished elsewhere. Such storage might include an additional device such as a local or remote storage unit well known to those in the art.

After comparing the power magnitude and the minimum threshold, if it is determined by the DSP that the power magnitude of the output is less than or below the minimum threshold, the particular amplitude 80 of the DC input used to enable the output to fall below the minimum threshold is stored in the DSP as a "temporary" calibration correction coefficient at step 102. Then, after calibration, when the radio transmitter is used to transmit an information signal, the temporary calibration coefficient is used to set an appropriate input power level for the information signal to substantially suppress the carrier frequency component. It should be appreciated, however, that the description "temporary," as used herein, is the establishment of the amplitude 80 of the DC input in the DSP for a selected time duration. In a preferred embodiment the selected time duration is a "user session" having a time length from about when the radio modem is turned on until it is turned off. In this manner, each user session is equipped with a unique calibration coefficient corresponding to the selected duration of time so that the next time a user session is initiated, another calibration will also occur and another calibration correction coefficient will be provided. Thus, suppression of the DC offset at the carrier frequency will occur again and will overcome components, such as self-calibrating DAC's, having different calibration parameters generated every time the device is powered on.

The selected time duration, however, may also have other useful lengths of time such as a predetermined time statically determined that causes the DSP to initiate its own calibration session upon the lapse of that time. It is also contemplated within the scope of this invention that the user may be able to initiate a calibration of the modulator by depressing a switch, for example, whenever the user desires. In this manner, the radio transmitter is advantageously provided with a means for being calibrated without requiring the added expense of taking the transmitter device to a repair depot.

If, on the other hand, after the DSP compares the power magnitude and the minimum threshold and the power magnitude is above or greater than the minimum threshold, the amplitude of the DC input is reiteratively altered until it falls below the minimum threshold. At step 104 the alteration occurs as either an increase or decrease of the amplitude of the DC input to a higher or lower value allowing "another" output of the modulator to be obtained at another power magnitude and carrier frequency. This another output will then be measured at step 106 and determined at step 108 if this another power magnitude exceeds or is less than the amplitude of the DC input used initially. If the power magnitude of the another output is in fact less than the first or initial DC input, another check is made to determine if the another power magnitude is below the minimum threshold at step 98.

If the another output is not below the initial power magnitude, then the magnitude is again altered, either by decreasing or increasing (the opposite alteration of what occurred previously) the amplitude of the DC input at step 110 and re-measuring the output at step 106. Eventually the output will fall below the minimum threshold at step 98 and a temporary calibration coefficient can be established in the DSP. With particular reference to FIG. 5, an output having a power magnitude below the minimum threshold is graphically depicted as 112. Again, it should be appreciated that the foregoing calibration description has been described as being performed in a singular channel, such as the I or Q channel in an I/Q modulator, and that these same steps would similarly be performed for the other channel not yet calibrated. The scope of the present invention, however, is not so limited as to the calibration of an I/Q modulator and the foregoing steps are equally applicable to any transmitter subject to drift characteristics over time. It is even contemplated that the foregoing method steps could be effectively accomplished within both channels simultaneously without requiring either the first or second channel to have priority.

Although the foregoing alteration of the amplitude of the DC input is described as being either increasing or decreasing and then as being oppositely decreased or increased, it should be appreciated that the alteration could also begin at one magnitude extreme and continually increase or decrease until the power magnitude falls beneath the minimum threshold. In either event, it is preferred that the alterations are predictable and systematic, although not required.

Likewise, although establishment of the temporary calibration coefficient is described herein as the time when the power magnitude of the output falls below both the initial power magnitude of the output and the minimum threshold, other equally efficacious alternatives exist for establishing when the appropriate amplitude of the DC input is to be stored in the DSP as the calibration correction coefficient. For example, it is also an appropriate calibration method to eliminate method steps 106 through 110 and simply perform step 96 after step 104. In this manner, the another power magnitude of the another output of the modulator is not compared to the initial power magnitude but is solely compared against the minimum threshold. This then would enable the temporary calibration coefficient to be established in the DSP as soon as the second or another output falls beneath the minimum threshold.

Another example includes establishing the temporary calibration coefficient when the power magnitude of the output is not only below the minimum threshold but is also considered to be the lowest possible power magnitude in and around the carrier frequency. Such a value would be the "local minimum." The local minimum can be determined by reiteratively altering the amplitude of the DC input, as before at step 104, until such time as the power magnitude of the output is not only beneath the minimum threshold but is also beneath any and all other outputs obtained after having numerously altered the amplitude of the DC input. While numerous reiterative alterations may seem overly long in time and complexity, it has been surprisingly estimated that about 50 reiterative alterations could be performed in about less than 1 second in incremental steps of less than about 1% of the previous amplitude value and still achieve a local minimum.

The present invention may also be embodied in still other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. In a frequency defined power spectrum, a method for suppressing a carrier frequency component in a radio transmitter, the steps comprising:

combining a substantially direct current (DC) input having an amplitude with a local oscillator input having a carrier frequency in a modulator to obtain an output having a power magnitude at said carrier frequency;

defining a minimum threshold power magnitude at said carrier frequency suitable for use in said radio transmitter that substantially suppresses said carrier frequency component when said power magnitude is less than said minimum threshold power magnitude;

altering by an altered amplitude said amplitude of said DC input until said power magnitude of said output is less than said minimum threshold power magnitude;

reiteratively performing said step of altering said amplitude of said DC input until said power magnitude achieves a local minimum power magnitude; and thereafter, establishing said altered amplitude of said DC input as a calibration correction coefficient.

2. A method according to claim 1, wherein said step of reiteratively performing said step of altering said amplitude of said DC input is performed in about 50 reiterative steps.

3. A method according to claim 2, wherein said step of altering said amplitude of said DC input is performed in increments of less than about 1% of a previous amplitude level.

4. In a frequency defined power spectrum, a method for calibrating a modulator having at least two channels to substantially suppress a carrier frequency component in a radio modem, the steps comprising:

in a first channel, a) combining a substantially direct current (DC) input having an amplitude with a local oscillator input having a carrier frequency in said modulator to obtain an output having a power magnitude at said carrier frequency;

b) defining a minimum threshold power magnitude at said carrier frequency suitable for use in said radio modem that substantially suppresses said carrier frequency component when said power magnitude is less than said minimum threshold power magnitude;

c) altering by an altered amplitude said amplitude of said DC input until said power magnitude of said output is less than said minimum threshold power magnitude, further comprising the steps of:

c1) sensing said power magnitude of said output with a power sensor electrically succeeding a transmitter stage of said modem;

c2) communicating said sensed power magnitude to a digital signal processor to allow adjustment of said amplitude of said DC input to one of a higher and lower value to provide another output having an altered power magnitude at said carrier frequency; and c3) repeating said steps c1) and c2) until said another power magnitude is less than said minimum threshold power magnitude;

d) thereafter, establishing said altered amplitude of said DC input as a calibration correction coefficient; and e) repeating said steps a) through d) for a second channel.

5. In a frequency defined power spectrum, a method for calibrating a modulator having at least two channels to substantially suppress a carrier frequency component in a radio modem, the steps comprising:

in a first channel, a) providing a statically calibrated zero representing the absence of information to a digital to analog convertor (DAC), said DAC electrically preceding said modulator, to enable input of said DC input to said modulator;

b) combining a substantially direct current (DC) input having an amplitude with a local oscillator input having a carrier frequency in said modulator to obtain an output having a power magnitude at said carrier frequency;

c) defining a minimum threshold power magnitude at said carrier frequency suitable for use in said radio modem that substantially suppresses said carrier frequency component when said power magnitude is less than said minimum threshold power magnitude;

d) altering by an altered amplitude said amplitude of said DC input until said power magnitude of said output is less than said minimum threshold power magnitude;

e) thereafter, establishing said altered amplitude of said DC input as a calibration correction coefficient; and f) repeating said steps a) through e) for a second channel.

6. In a frequency defined power spectrum, a method for calibrating a modulator having at least two channels to substantially suppress a carrier frequency component in a radio modem, the steps comprising:

in a first channel, a) combining a substantially direct current (DC) input having an amplitude with a local oscillator input having a carrier frequency in said modulator to obtain an output having a power magnitude at said carrier frequency;

b) defining a minimum threshold power magnitude at said carrier frequency suitable for use in said radio modem that substantially suppresses said carrier frequency component when said power magnitude is less than said minimum threshold power magnitude;

c) altering by an altered amplitude said amplitude of said DC input until said power magnitude of said output is less than said minimum threshold power magnitude;

d) thereafter, establishing said altered amplitude of said DC input as a calibration correction coefficient, said step further comprising the step of temporarily storing said calibration correction coefficient in a digital signal processor for a selected time duration, thereafter when said modem is used to transmit information during said selected time duration, said digital signal processor employs said calibration correction coefficient to set a selected power level for an information signal input to the modulator thereby substantially suppressing said carrier frequency component; and e) repeating said steps a) through d) for a second channel.

7. A radio modem being capable of dynamically calibrating a modulator therein to substantially suppress a carrier frequency component in a frequency defined power spectrum, comprising:

a modulator electrically adapted to receive a local oscillator input having a carrier frequency and a substantially direct current (DC) input having an amplitude to produce an output having a power magnitude at said carrier frequency in said frequency defined power spectrum; and a power sensor electrically succeeding said modulator for measuring said power magnitude of said output to enable a digital signal processor electrically between said modulator and said power sensor to compare said measured power magnitude with a minimum threshold power magnitude and when said power magnitude is above said minimum threshold reiteratively alter said amplitude of said DC input until said measured power magnitude is less than said minimum threshold power magnitude, said minimum threshold power magnitude being stored in said digital signal processor to define a suitable power magnitude threshold at said carrier frequency below which said carrier frequency component will be substantially suppressed.

8. A radio modem according to claim 7, further comprising a transmitter stage electrically preceding said power sensor for amplifying said output of said modulator in preparation for transmitting information across a communication channel.

9. A radio modem according to claim 7, wherein said modulator is a two channel modulator for facilitating numerous modulation schemes therein, said two channels being an in-phase channel and a quadrature channel.

10. A radio modem according to claim 7, further comprising a digital to analog convertor (DAC) in electrical succession to said digital signal processor, said DAC being capable of receiving a statically calibrated zero representing the absence of information to produce said substantial DC input for said modulator.

* * * * *